United States Patent
Hiyoshi et al.

(10) Patent No.: US 6,765,239 B2
(45) Date of Patent: Jul. 20, 2004

(54) SEMICONDUCTOR DEVICE HAVING JUNCTION-TERMINATION STRUCTURE OF RESURF TYPE

(75) Inventors: Michiaki Hiyoshi, Yokohama (JP); Shigeru Hasegawa, Yokohama (JP); Naoyuki Inoue, Toda (JP); Tatsuo Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/187,369

(22) Filed: Jul. 2, 2002

(65) Prior Publication Data

US 2003/0006497 A1 Jan. 9, 2003

(30) Foreign Application Priority Data

Jul. 6, 2001 (JP) ........................................ 2001-206924

(51) Int. Cl.[7] ........................ H01L 29/74; H01L 31/111
(52) U.S. Cl. ..................................................... 257/107
(58) Field of Search ............................... 257/168, 169, 257/170, 171, 172, 119, 120, 121, 122, 123, 124, 125, 128, 131, 688, 129, 155, 62, 126, 130, 132, 133, 134, 135, 141, 142

(56) References Cited

U.S. PATENT DOCUMENTS 5,040,042 A  *  8/1991  Bauer et al. .................. 357/38
5,114,876 A  *  5/1992  Weiner ......................... 437/89
5,610,439 A       3/1997  Hiyoshi et al.

* cited by examiner

*Primary Examiner*—Long Pham
*Assistant Examiner*—Dana Farahani
(74) *Attorney, Agent, or Firm*—Oblon, Spivak, McClelland, Maier & Neustadt, P.C.

(57) ABSTRACT

A semiconductor device includes an active region with a main semiconductor device section, and a junction-termination region therearound. A first diffusion layer of a second conductivity type is formed in a surface of a first semiconductor layer of a first conductivity type, and extends from the active region into the junction-termination region. A second diffusion layer of the second conductivity type is formed in contact with the first diffusion layer, and extends in the junction-termination region. A first contact electrode is disposed in the active region and in contact with the first diffusion layer, and electrically connected to a first main electrode of the main semiconductor device section. A second contact electrode is disposed in the junction-termination region and in contact with the first diffusion layer, and surrounds the active region. A connection electrode electrically connects the first and second contact electrodes to each other.

24 Claims, 4 Drawing Sheets

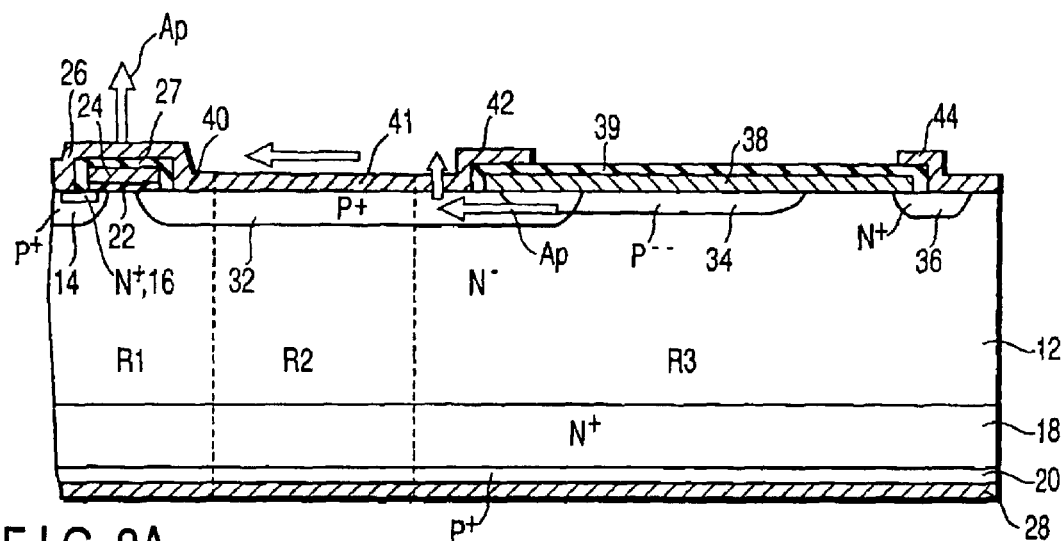
F I G. 2A
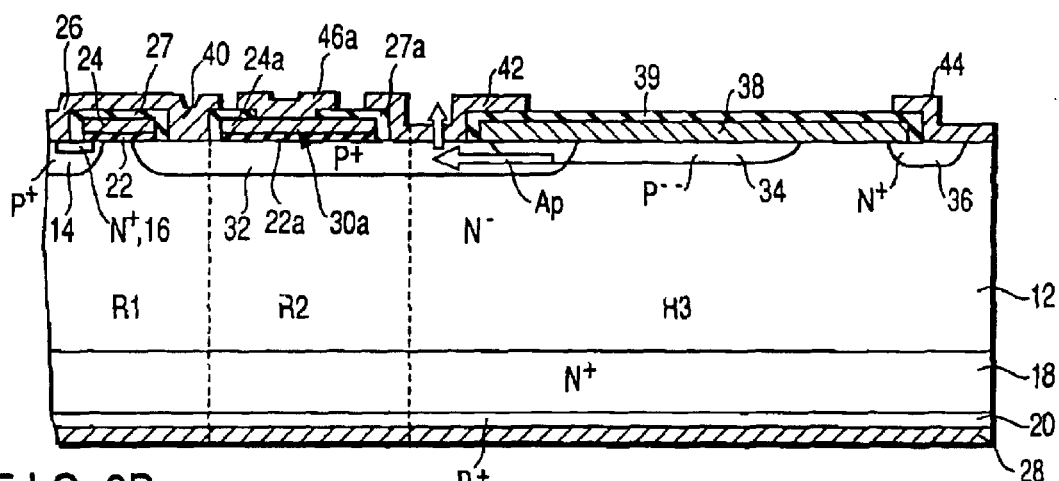
F I G. 2B
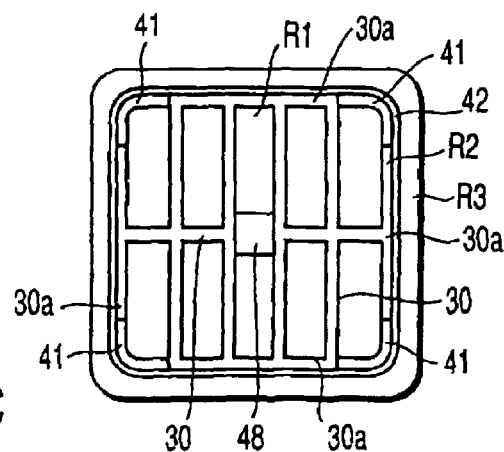
F I G. 2C

SEMICONDUCTOR DEVICE HAVING JUNCTION-TERMINATION STRUCTURE OF RESURF TYPE

CROSS-REFERENCE TO RELATED APPLICATIONS

This application is based upon and claims the benefit of priority from the prior Japanese Patent Application No. 2001-206924, Jul. 6, 2001, the entire contents of which are incorporated herein by reference.

BACKGROUND OF THE INVENTION

1. Field of the Invention

The present invention relates to a semiconductor device having a junction-termination structure of a RESURF (RESURF: REduced SURface Field) type, and particularly to an improvement of the junction-termination region of a semiconductor chip.

2. Description of the Related Art

FIG. 4A is a sectional view schematically showing the junction-termination region and its vicinity of a conventional punch-through type IGBT (Insulated Gate Bipolar Transistor) chip having a junction-termination structure of a RESURF type. As shown in FIG. 4A, the IGBT chip has an active region R11, a junction-termination region R13 located around the active region R11, and a separation region R12 interposed between the active region R11 and the junction-termination region R13. An $N^-$-first base layer 62, an $N^+$-buffer layer 68, and a $P^+$-collector layer 70 are disposed entirely over these regions R11 to R13. In the active region R11, $P^+$-second base layers 64 are formed in the surface of the first base layer 62, and $N^+$-emitter layers 66 are formed in the surface of the second base layers 64.

A gate electrode 74 is disposed on and faces, through a gate insulating film 72, the portion of each second base layer 64 sandwiched between the first base layer 62 and the corresponding emitter layer 66. An emitter electrode 76 is disposed in contact with the second base layers 64 and the emitter layers 66. A collector electrode 78 is disposed in contact with the collector layer 70.

A $P^+$-first diffusion layer 82 is formed in the front surface of the first base layer 62, and extends from the active region R11 through the separation region R12 into the junction-termination region R13. In the junction-termination region R13, a $P^{--}$-second diffusion layer 84 for relaxing the surface electric field is formed in the front surface of the first base layer 62. In the active region R11, a contact electrode 90 is disposed in contact with the first diffusion layer 82. The contact electrode 90 is electrically connected to the emitter electrode 76.

According to research conducted by the present inventors, it has been found in the structure shown in FIG. 4A, that there are ill effects of a parasitic current flowing in the junction-termination region, as described later.

BRIEF SUMMARY OF THE INVENTION

According to a first aspect of the present invention, there is provided a semiconductor device including an active region where a main semiconductor device section is disposed, and a junction-termination region located around the active region, the device comprising:

a first semiconductor layer of a first conductivity type, disposed as a semiconductor active layer common to the active region and the junction-termination region;

a first diffusion layer of a second conductivity type formed in a surface of the first semiconductor layer, and extending from the active region into the junction-termination region;

a second diffusion layer of the second conductivity type formed in a surface of the first semiconductor layer and in contact with the first diffusion layer, the second diffusion layer extending in the junction-termination region, and having a carrier impurity concentration lower than that of the first diffusion layer;

a first contact electrode disposed in the active region and in contact with the first diffusion layer, and electrically connected to a first main electrode of the main semiconductor device section;

a second contact electrode disposed in the junction-termination region and in contact with the first diffusion layer, and surrounding the active region; and a connection electrode electrically connecting the first and second contact electrodes to each other.

According to a second aspect of the present invention, there is provided a semiconductor device including an active region, a junction-termination region located around the active region, and an intermediate region interposed between the active region and the junction-termination region, the device comprising:

a first semiconductor layer of a first conductivity type, disposed as a semiconductor active layer common to the active region, the intermediate region, and the junction-termination region;

a second semiconductor layer of a second conductivity type formed in one surface of the first semiconductor layer in the active region;

a third semiconductor layer of the first conductivity type formed in a surface of the second semiconductor layer;

a fourth semiconductor layer disposed on or in another surface of the first semiconductor layer in the active region;

a gate electrode facing, thorough a gate insulating film, a portion of the second semiconductor layer sandwiched between the first semiconductor layer and the third semiconductor layer;

a first main electrode disposed in contact with the second semiconductor layer and the third semiconductor layer;

a second main electrode disposed in contact with the fourth semiconductor layer;

a first diffusion layer of a second conductivity type formed in a surface of the first semiconductor layer on the same side as the second semiconductor layer, and extending from the active region through the intermediate region into the junction-termination region, the second semiconductor layer and the first diffusion layer having substantially the same carrier impurity concentration;

a second diffusion layer of the second conductivity type formed in a surface of the first semiconductor layer and in contact with the first diffusion layer, the second diffusion layer extending in the junction-termination region, and having a carrier impurity concentration lower than that of the first diffusion layer;

a first contact electrode disposed in the active region and in contact with the first diffusion layer, and electrically connected to the first main electrode;

a second contact electrode disposed in the junction-termination region and in contact with the first diffusion layer, and surrounding the active region; and a connection electrode disposed in the intermediate region, and electrically connecting the first and second contact electrodes to each other.

BRIEF DESCRIPTION OF THE SEVERAL VIEWS OF THE DRAWING

FIG. 2A is a sectional view schematically showing the junction-termination region and its vicinity at the corner portions of a punch-through type IGBT chip, which is a high breakdown-voltage semiconductor device according to another embodiment of the present invention;

FIG. 2B is a sectional view schematically showing the junction-termination region and its vicinity at the side portions of the IGBT chip shown in FIG. 2A;

FIG. 2C is a view schematically showing the plan view layout of the IGBT chip shown in FIGS. 2A and 2B;

DETAILED DESCRIPTION OF THE INVENTION

In the process of developing the present invention, the inventors studied problems caused in the conventional IGBT chip described with reference to FIG. 4A. As a result, the present inventors have arrived at the finding given below.

Figure 4A:
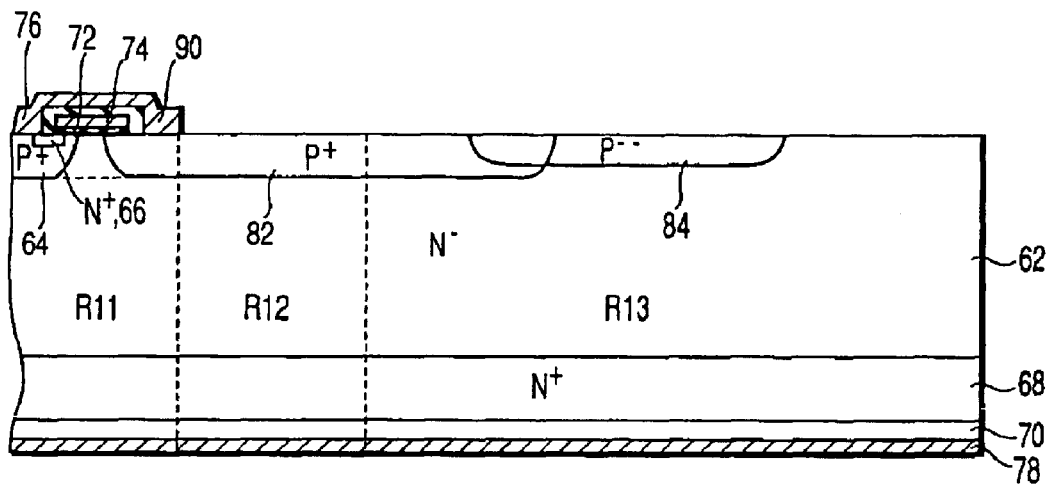
FIG. 4A is a sectional view schematically showing the junction-termination region and its vicinity of a conventional punch-through type IGBT chip having a junction-termination structure of a RESURF type.
Figure 4B:
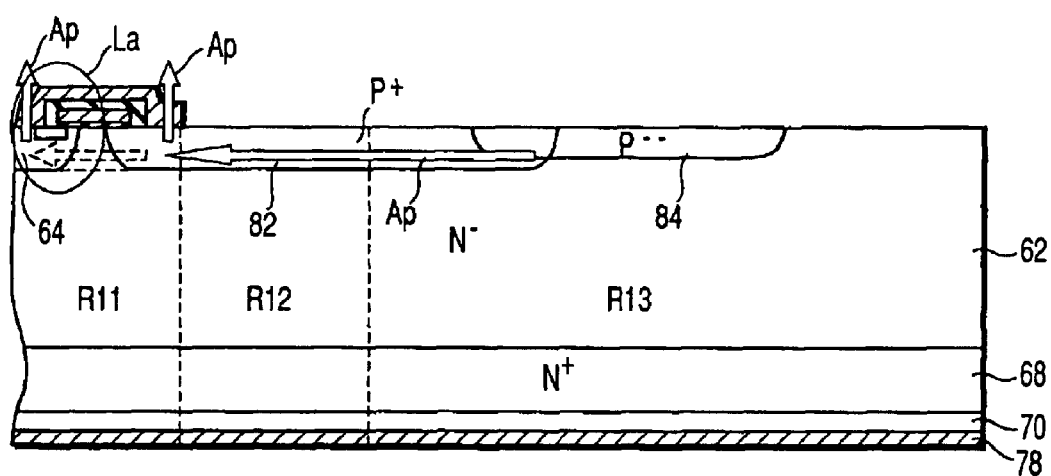
FIG. 4B is a sectional view showing problems caused in the IGBT chip shown in FIG. 4A.

FIG. 4B is a sectional view showing problems caused in the IGBT chip shown in FIG. 4A. In the structure shown in FIG. 4A, a parasitic transistor exists in the junction-termination region R13. The parasitic transistor is induced and activated by a high electric field at the outer end of the first diffusion layer 82, when a turning-off or short-circuiting operation is performed. Specifically, a parasitic current Ap flows in the function-termination region R13, from the collector electrode 78 through the collector layer 70, the buffer layer 68, and the first base layer 62, when a turning-off or short-circuiting operation is performed. As indicated with a symbol Ap in FIG. 4B, the parasitic current having flowed from the first base layer 62 into the first diffusion layer 82 laterally flows in the first diffusion layer 82, and is exhausted from the contact electrode 90 into the emitter electrode 76.

When the amount of this parasitic current is large, a problem arises such that the first diffusion layer 82 and so forth are thermally deteriorated in the separation region R12. Furthermore, as the case may be, as indicated with a symbol La in FIG. 4B, the parasitic current flows into second base layers 64 in its vicinity and causes a latched-up state. As the breakdown voltage of the device is higher, the length (width) of the RESURF structure is larger in design, and thus the parasitic transistor becomes more influential.

In order to prevent the parasitic current from flowing in the first diffusion layer 82, it seems feasible to reduce the carrier impurity concentration of the first diffusion layer, or increase the length (width) of the first diffusion layer, so that its resistance is higher. However, where the carrier impurity concentration of the first diffusion layer is reduced, it is difficult to obtain the necessary breakdown voltage. Where the length (width) of the first diffusion layer is increased, the efficiency of use of the device space is lowered.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1A:
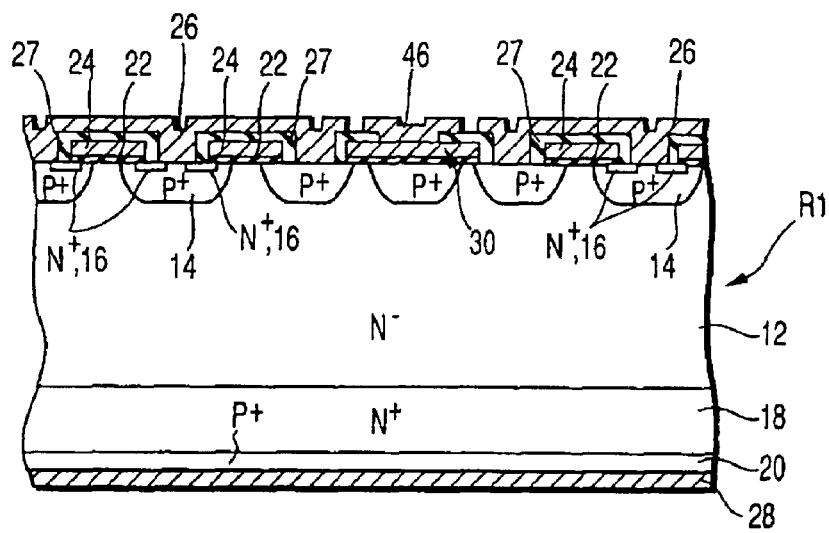
FIG. 1A is a sectional view schematically showing the active region of a punch-through type IGBT chip, which is a high breakdown-voltage semiconductor device according to an embodiment of the present invention.
Figure 1B:
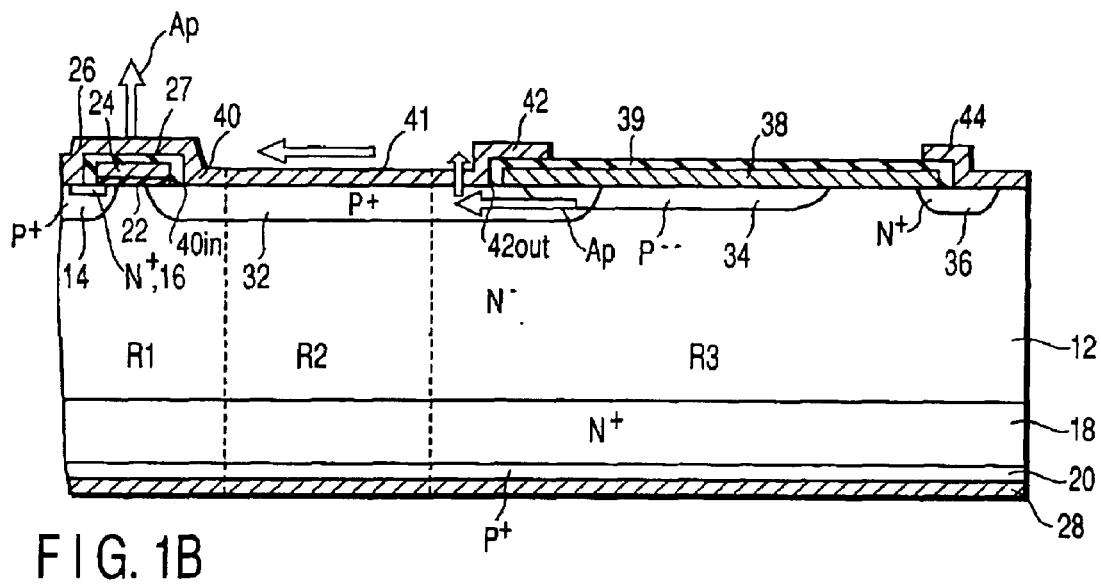
FIG. 1B is a sectional view schematically showing the junction-termination region and its vicinity of the IGBT chip shown in FIG. 1A.
Figure 1C:
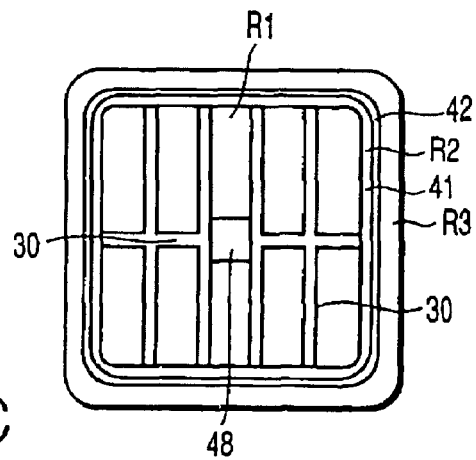
FIG. 1C is a view schematically showing the plan view layout of the IGBT chip shown in FIGS. 1A and 1B.

FIG. 1A is a sectional view schematically showing the active region of a punch-through type IGBT chip, which is a high breakdown-voltage semiconductor device according to an embodiment of the present invention. FIG. 1B is a sectional view schematically showing the junction-termination region and its vicinity of the IGBT chip shown in FIG. 1A. FIG. 1C is a view schematically showing the plan view layout of the IGBT chip shown in FIGS. 1A and 1B.

As shown in FIGS. 1A to 1C, the IGBT chip has an active region R1, a junction-termination region R3 located around the active region R1, and an intermediate region R2 interposed between the active region R1 and the junction-termination region R3. The intermediate region R2 is disposed between the active region R1 and the junction-termination region R3, to prevent a current other than the designed device current from flowing from the junction-termination region R3 into the active region R1. In other words, it can be said that the intermediate region R2 is a region disposed as a part of the junction-termination region R3 on the side adjacent to the active region R1, to prevent ill effects of the junction-termination region R3 affecting the active region R1. An $N^-$-first base layer (the low concentration layer of a first semiconductor layer) 12 having a carrier impurity concentration of from $5\times10^{12}$ to $5\times10^{13}$ $cm^{-3}$ is disposed as a common semiconductor active layer entirely over these regions R1 to R3.

In the active region R1, $P^+$-second base layers (second semiconductor layers) 14 having a high carrier impurity concentration of from $1\times10^{17}$ to $1\times10^{18}$ $cm^{-3}$ are formed in the surface of the first base layer 12 on the top side. $N^+$-emitter layers (third semiconductor layers) 16 having a high carrier impurity concentration of from $1\times10^{18}$ to $1\times10^{20}$ $cm^{-3}$ are formed in the surfaces of the second base layers 14. An $N^+$-buffer layer (the high concentration layer of the first semiconductor layer) 18 having a carrier impurity concentration of from $1\times10^{15}$ to $1\times10^{18}$ $cm^{-3}$, which is higher than that of the first base layer 12, is formed on or in the surface of the first base layer 12 on the bottom side. Furthermore, a $P^+$-collector layer (a fourth semiconductor layer) 20 having a high carrier impurity concentration of from $1\times10^{17}$ to $1\times10^{19}$ $cm^{-3}$ is formed on or in the surface of the buffer layer 18.

A gate electrode 24 is disposed on and faces, through a gate insulating film 22, the portion of each second base layer 14 sandwiched between the first base layer 12 and the corresponding emitter layer 16. The gate electrode 24 is made of, e.g., polycrystalline silicon. An emitter electrode (a first main electrode) 26 is disposed in contact with the second base layers 14 and the emitter layers 16. The emitter electrode 26 is disposed to cover the gate electrodes 24 and isolated from the gate electrodes 24 by an interlayer insulating film 27. A collector electrode (a second main electrode) 28 is disposed in contact with the collector layer 20. The emitter electrode 26 and the collector electrode 28 are made of, e.g., a metal, such as Al.

With the arrangement described above, unit cells of an IGBT, which are main semiconductor device portions, are constructed in the active region R1. A number of such unit cells of an IGBT are formed in a repeated pattern in the active region R1. The buffer layer 18, the collector layer 20, and the collector electrode 28 are formed entirely on the bottom side of the IGBT chip, so as to be in common to all the unit cells, and are also extended on the bottom side of the junction-termination region R3.

The respective gate electrodes 24 of the unit cells are electrically connected to each other, and further electrically connected to a lead-out wiring layer 46 through common gate wiring portions 30 disposed at certain intervals. The entire lead-out wiring layer 46 is supplied with a common gate voltage from a gate pad 48 disposed at the center of the IGBT chip. Each of the gate wiring portions 30 has a three-layer structure of an insulating film, a wiring layer, and an insulating film, which are formed in the same steps and made of the same materials as those for the gate insulating film 22, the gate electrode 24, and the interlayer insulating film 27, respectively. The lead-out wiring layer 46 is formed in the same step and made of the same metal, such as Al, as those for the emitter electrode 26.

A P$^+$-first diffusion layer 32 having a high carrier impurity concentration of from $1\times10^{17}$ to $1\times10^{18}$ cm$^{-3}$ is formed in the surface of the first base layer 12 on the top side to extend from the active region R1 through the intermediate region R2 into the junction-termination region R3. The first diffusion layer 32 is conceived to stop expansion of a depletion layer from a second diffusion layer 34 described later. In order to make the manufacturing steps simple, the first diffusion layer 32 is formed by introducing an impurity into the first base layer 12, in the same step and with the same conditions as those for the second base layers 14. Accordingly, the first diffusion layer 32 and the second base layers 14 have substantially the same carrier impurity concentration. However, the first diffusion layer 32 and the second base layers 14 may have different carrier impurity concentrations.

In the junction-termination region R3, a P$^{--}$-second diffusion layer 34 having a carrier impurity concentration of from $1\times10^{14}$ to $1\times10^{16}$ cm$^{-3}$, which is far lower than that of the first diffusion layer 32, is formed in the surface of the first base layer 12 on the top side. The second diffusion layer 34 overlaps the first diffusion layer 32, and extends in the junction-termination region R3 toward the outer end of the junction-termination region R3. The second diffusion layer 34 functions as a RESURF layer for relaxing the surface electric field of the junction-termination region R3.

An N$^+$-end diffusion layer 36 is formed in the surface of the first base layer 12 on the top side, at a position on the outer end of the junction-termination region R3 and distant from the RESURF layer 34. A high-resistance conductive film 38 having a resistively of from $1\times10^7$ to $1\times10^{11}$ Ω·cm, which is made of, e.g., SIPOS (Semi-Insulating Polycrystalline Silicon), is disposed on the surface of the RESURF layer 34 and extended onto the surface of the end diffusion layer 36. The high-resistance conductive film 38 is covered with an insulating film 39. A field plate electrode (a second contact electrode) 42 and a stopper electrode 44 are disposed to sandwich the high-resistance conductive film 38 through the insulating film 39. The stopper electrode 44 is disposed in contact with the end diffusion layer 36. The field plate electrode 42 is disposed in contact with the first diffusion layer 32 at the inner end of the junction-termination region R3.

A first contact electrode 40 is disposed in contact with the first diffusion layer 32 in the active region R1. The first contact electrode 40 is formed as an integral portion of the emitter electrode 26 of a unit cell located at the end of the active region R1. In other words, the first contact electrode 40 is electrically connected to the emitter electrode 26 through an electrode portion, which covers the gate electrode 24 through the interlayer insulating film 27.

Furthermore, in the intermediate region R2, a connection electrode 41 is disposed to electrically connect the first contact electrode 40 and the field plate electrode (the second contact electrode) 42 to each other. The connection electrode 41 is formed directly on the first diffusion layer 32, and thus is in contact with the first diffusion layer 32. The electrodes 40, 41, 42, and 44 are integrally formed in the same step and made of the same metal, such as Al, as those for the emitter electrode 26.

In the high breakdown-voltage semiconductor device shown in FIGS. 1A to 1C, when a turning-off or short-circuiting operation is performed, a parasitic current is induced by a high electric field at the outer end of the first diffusion layer 32, and flows in the junction-termination region R3 from the collector electrode 28, through the collector layer 20, the buffer layer 18, and the first base layer 12. As indicated with a symbol Ap in FIG. 1B, the parasitic current having flowed from the first base layer 12 into the first diffusion layer 32 is exhausted from the second contact electrode 42 through the connection electrode 41 and the first contact electrode 40 into the emitter electrode 26.

Accordingly, in this high breakdown-voltage semiconductor device, when a turning-off or short-circuiting operation is performed, substantially no parasitic current flows through the portion of the first diffusion layer 32 in the intermediate region R2 into the emitter electrode 26. As a result, it is possible to solve conventional problems in that the first diffusion layer 32 is thermally deteriorated, a latched-up state is brought about in nearby emitters, etc. when a turning-off or short-circuiting operation is performed.

FIG. 2A is a sectional view schematically showing the junction-termination region and its vicinity at the corner portions of a punch-through type IGBT chip, which is a high breakdown-voltage semiconductor device according to another embodiment of the present invention. FIG. 2B is a sectional view schematically showing the junction-termination region and its vicinity at the side portions of the IGBT chip shown in FIG. 2A. FIG. 2C is a view schematically showing the plan view layout of the IGBT chip shown in FIGS. 2A and 2B.

As shown in FIG. 2C, this IGBT chip has substantially rectangular shape in the plan view. Accordingly, a junction-termination region R3 surrounding the active region R1 has four linear side portions extending along the contour of the active region R1, and four corner portions connecting the side portions. In general, at corner portions, since an electric field is concentrated, so is a parasitic current, while at side portions, since an electric field is less concentrated, so is parasitic current. In light of this fact, a passage for a parasitic current to bypass a first diffusion layer 32 is formed only in the corner portions, according to this embodiment.

Specifically, as shown in FIG. 2A, first and second contact electrodes 40 and 42 are electrically connected to each other by a connection electrode 41 at the corner portions, while, as shown in FIG. 2B, they are separated from each other at side portions. At side portions, a gate wiring portion 30a is disposed between the first and second contact electrodes 40 and 42, and a lead-out wiring layer 46a is disposed thereon and insulated from the first and second contact electrodes 40 and 42.

The gate wiring portion 30a has a three-layer structure of an insulating film 22a, a wiring layer 24a, and an insulating film 27a, which are formed in the same steps and made of the same materials as those for a gate insulating film 22, a gate electrode 24, and an interlayer insulating film 27, respectively. The lead-out wiring layer 46a is formed in the same step and made of the same metal, such as Al, as those for the emitter electrode 26. The lead-out wiring layer 46a is electrically connected to the gate electrode 24 through the wiring layer 24a.

Although the connection electrode 41 is cut at the side portions, the second contact electrode 42 is formed entirely continuous in the angular direction on the junction-termination region R3. In other words, the second contact electrode 42 has a ring shape, and extends over the junction-termination region R3, and is connected to the first contact electrode 40 through the connection electrode 41 at each of the corner portions. Accordingly, when a turning-off or short-circuiting operation is performed, a parasitic current is drawn from the first diffusion layer 32 into the second contact electrode 42 all over the junction-termination region R3, and is then exhausted through the connection electrode 41 at each of the corner portions into the emitter electrode 26.

Accordingly, in the high breakdown-voltage semiconductor device shown in FIGS. 2A to 2C, it is possible, as in the device shown in FIGS. 1A to 1C, to solve conventional problems in that the first diffusion layer 32 is thermally deteriorated, a latched-up state is brought about in nearby emitters, etc. when a turning-off or short-circuiting operation is performed. In addition, since the gate wiring portion 30a and the lead-out wiring layer 46a for the gate electrode 24 are disposed at each of the side portions outside the active region R1, the gate control voltage can have a high planar uniformity over the chip.

Figure 3A:
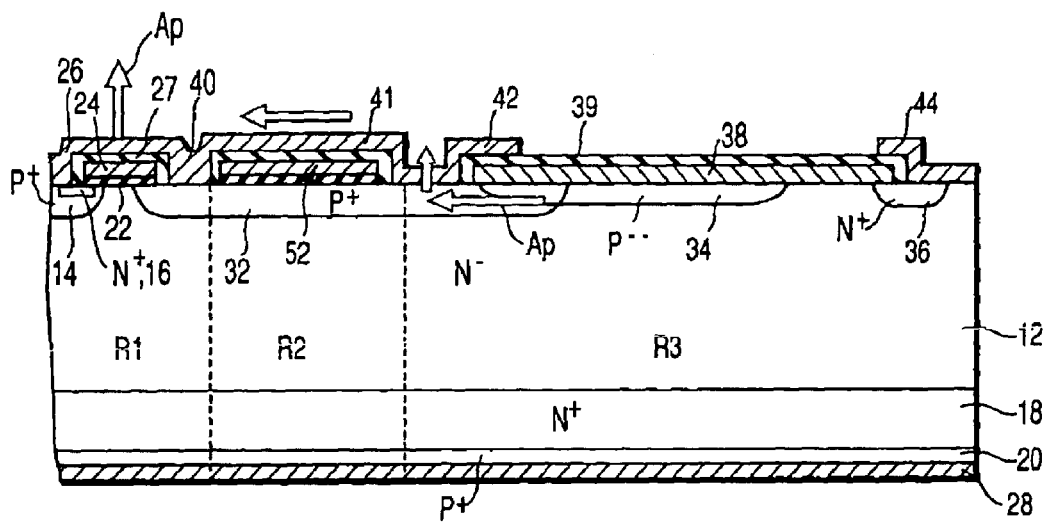
FIG. 3A is a sectional view schematically showing the junction-termination region and its vicinity of a punch-through type IGBT chip, which is a high breakdown-voltage semiconductor device according to still another embodiment of the present invention.
Figure 3B:
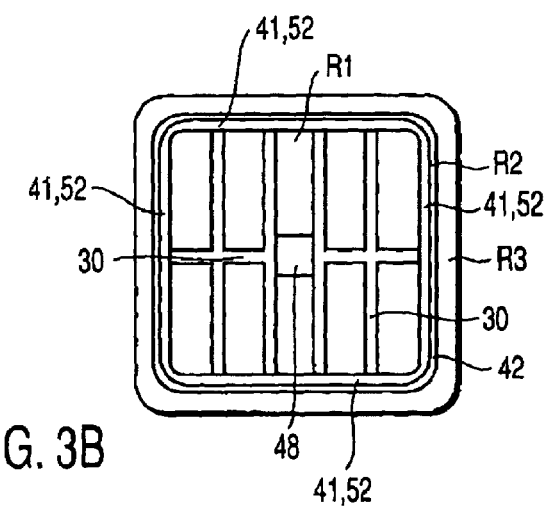
FIG. 3B is a view schematically showing the plan view layout of the IGBT chip shown in FIG. 3A.

FIG. 3A is a sectional view schematically showing the junction-termination region and its vicinity of a punch-through type IGBT chip, which is a high breakdown-voltage semiconductor device according to still another embodiment of the present invention. FIG. 3B is a view schematically showing the plan view layout of the IGBT chip shown in FIG. 3A. In this embodiment, a connection electrode 41 is disposed on a dummy wiring portion 52. Accordingly, the connection electrode 41 does not come into contact with a first diffusion layer 32, but forms a bridge between first and second contact electrodes 40 and 42.

The dummy wiring portion 52 has a three-layer structure of an insulating film, a wiring layer, and an insulating film, which are formed in the same steps and made of the same materials as those for a gate insulating film 22, a gate electrode 24, and an interlayer insulating film 27, respectively. The dummy wiring portion 52 may be formed by leaving, as it is, a gate wiring portion disposed in an intermediate region R2 in a conventional structure. The connection electrode 41 is used for connecting the second contact electrode 42 through the first contact electrode 40 to the emitter electrode 26, and thus requires no contact with the first diffusion layer 32. Accordingly, by adopting the structure shown in FIG. 3A, it is possible to achieve an expected effect according to the present invention, without greatly changing conventional structural patterns.

In each of the embodiments described above, the innermost position 40in (see FIG. 1A), where the first contact electrode 40 is in contact with the first diffusion layer 32, and the outermost position 42out (see FIG. 1A), where the second contact electrode 42 is in contact with the first diffusion layer 32 are selected in light of removing ill effects of a parasitic current onto the first diffusion layer 32. Specifically, in a first direction connecting the active region R1 to the junction-termination region R2 with the shortest distance, the distance between the positions 40in and 42out is set to be long and fall in a range of from 10 to 300 $\mu$m, and preferably of from 100 to 300 $\mu$m.

In each of the embodiments described above, the structural features are applied to an IGBT, as an example. The features of each of the embodiments may be applied to another semiconductor device, such as an FET (Field Effect Transistor).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device including an active region where a main semiconductor device section is disposed, and a junction-termination region located around the active region, the device comprising:

a semiconductor layer of a first conductivity type, disposed as a semiconductor active layer common to the active region and the junction-termination region;

a first diffusion layer of a second conductivity type formed in a surface of the semiconductor layer, and extending from the active region into the junction-termination region;

a second diffusion layer of the second conductivity type formed in a surface of the semiconductor layer and in contact with the first diffusion layer, the second diffusion layer extending in the junction-termination region, and having a carrier impurity concentration lower than that of the first diffusion layer;

a first contact electrode disposed in the active region and in contact with the first diffusion layer, and electrically connected to a first main electrode of the main semiconductor device section;

a second contact electrode disposed in the junction-termination region and in contact with the first diffusion layer, and surrounding the active region; and a connection electrode electrically connecting the first and second contact electrodes to each other, wherein the main semiconductor device section comprises a second main electrode extending from the active region into the junction-termination region, and, when the main semiconductor device section is turned off, a current flows in the junction-termination region from the second main electrode, through the semiconductor layer and the first diffusion layer, into the second contact electrode.

2. A device according to claim 1, wherein the junction-termination region comprises a plurality of linear side portions extending along a contour of the active region and a plurality of corner portions connecting the side portions, and the connection electrode is not disposed at the side portions, but disposed at the corner portions.

3. A device according to claim 1, wherein the main semiconductor device section comprises:
    a first base layer of the first conductivity type, which is part of the semiconductor layer;
    a second base layer of the second conductivity type disposed on the first base layer;
    an emitter layer of the first conductivity type disposed on the second base layer;
    a collector layer of the second conductivity type disposed on the first base layer and separated from the second base layer;
    a gate electrode facing, through a gate insulating film, a portion of the second base layer sandwiched between the first base layer and the emitter layer,
    the first main electrode disposed in contact with the second base layer and the emitter layer, and electrically connected to the first contact electrode; and
    the second main electrode in contact with the collector layer.

4. A device according to claim 3, wherein the second base layer is formed in a surface of the first base layer reverse to the collector layer, and the emitter layer is formed in a surface of the second base layer.

5. A device according to claim 4, wherein the second base layer and the first diffusion layer have substantially the same carrier impurity concentration.

6. A device according to claim 3, wherein the collector layer and the second main electrode extend from the active region into the junction-termination region.

7. A device according to claim 1, wherein the connection electrode is disposed in contact with the first diffusion layer.

8. A device according to claim 1, wherein the first contact electrode, the second contact electrode, and the connection electrode are integrally formed.

9. A device according to claim 1, wherein, in a first direction connecting the active region to the junction-termination region with a shortest distance, a distance between an innermost position where the first contact electrode is in contact with the first diffusion layer, and an outermost position where the second contact electrode is in contact with the first diffusion layer is set to fall in a range of from 10 to 300 $\mu$m.

10. A semiconductor device including an active region, a junction-termination region located around the active region, and an intermediate region interposed between the active region and the junction-termination region, the device comprising:
    a first semiconductor layer of a first conductivity type, disposed as a semiconductor active layer common to the active region, the intermediate region, and the junction-termination region;
    a second semiconductor layer of a second conductivity type formed in one surface of the first semiconductor layer in the active region;
    a third semiconductor layer of the first conductivity type formed in a surface of the second semiconductor layer;
    a fourth semiconductor layer disposed on or in another surface of the first semiconductor layer in the active region;
    a gate electrode facing, through a gate insulating film, a portion of the second semiconductor layer sandwiched between the first semiconductor layer and the third semiconductor layer;
    a first main electrode disposed in contact with the second semiconductor layer and the third semiconductor layer;
    a second main electrode disposed in contact with the fourth semiconductor layer;
    a first diffusion layer of a second conductivity type formed in a surface of the first semiconductor layer on the same side as the second semiconductor layer, and extending from the active region through the intermediate region into the junction-termination region, the second semiconductor layer and the first diffusion layer having substantially the same carrier impurity concentration;
    a second diffusion layer of the second conductivity type formed in a surface of the first semiconductor layer and in contact with the first diffusion layer, the second diffusion layer extending in the junction-termination region, and having a carrier impurity concentration lower than that of the first diffusion layer;
    a first contact electrode disposed in the active region and in contact with the first diffusion layer, and electrically connected to the first main, electrode;
    a second contact electrode disposed in the junction-termination region and in contact with the first diffusion layer, and surrounding the active region; and
    a connection electrode disposed in the intermediate region, and electrically connecting the first and second contact electrodes to each other.

11. A device according to claim 10, wherein the fourth semiconductor layer and the second main electrode extend from the active region into the junction-termination region.

12. A device according to claim 10, wherein the first semiconductor layer comprises a high concentration layer disposed on the fourth semiconductor layer side, and a low concentration layer disposed on the second semiconductor layer side and having a carrier impurity concentration lower than that of the high concentration layer.

13. A device according to claim 10, wherein the junction-termination region comprises a plurality of linear side portions extending along a contour of the active region and a plurality of corner portions connecting the side portions, and the connection electrode is not disposed at the side portions, but disposed at the corner portions.

14. A device according to claim 13, further comprising a lead-out wiring layer connected to the gate electrode, and disposed between the first and second contact electrodes at each of the corner portions, while being insulated from the first and second contact electrodes.

15. A device according to claim 10, wherein the first, second, third, and fourth semiconductor layers are a first base layer, a second base layer, an emitter layer, and a collector layer, respectively.

16. A device according to claim 10, wherein the connection electrode is disposed in contact with the first diffusion layer.

17. A device according to claim 10, further comprising a high-resistance conductive film disposed on a surface of the second diffusion layer.

18. A device according to claim 10, wherein the first contact electrode, the second contact electrode, and the connection electrode are integrally formed.

19. A device according to claim 10, wherein, in a first direction connecting the active region to the junction-termination region with a shortest distance, a distance between an innermost position where the first contact electrode is in contact with the first diffusion layer, and an outermost position where the second contact electrode is in contact with the first diffusion layer is set to fall in a range of from 10 to 300 $\mu$m.

20. A semiconductor device including an active region where a main semiconductor device section is disposed, and a junction-termination region located around the active region, the device comprising:

a semiconductor layer of a first conductivity type, disposed as a semiconductor active layer common to the active region and the junction-termination region;

a first diffusion layer of a second conductivity type formed in a surface of the semiconductor layer, and extending from the active region into the junction-termination region;

a second diffusion layer of the second conductivity type formed in a surface of the semiconductor layer and in contact with the first diffusion layer, the second, diffusion layer extending in the junction-termination region, and having a carrier impurity concentration lower than that of the first diffusion layer;

a first contact electrode disposed in the active region and in contact with the first diffusion layer, and electrically connected to a first main electrode of the main semiconductor device section;

a second contact electrode disposed in the junction-termination region and in contact with the first diffusion layer, and surrounding the active region; and a connection electrode electrically connecting the first and second contact electrodes to each other, wherein the main semiconductor device section comprises:

a first base layer of the first conductivity type, which is part of the semiconductor layer;

a second base layer of the second conductivity type disposed on the first base layer;

an emitter layer of the first conductivity type disposed on the second base layer;

a collector layer of the second conductivity type disposed on the first base layer and separated from the second base layer;

a gate electrode facing, through a gate insulating film, a portion of the second base layer sandwiched between the first base layer and the emitter layer;

the first main electrode disposed in contact with the second base layer and the emitter layer, and electrically connected to the first contact electrode; and a second main electrode in contact with the collector layer.

21. A device according to claim 20, wherein the junction-termination region comprises a plurality of linear side portions extending along a contour of the active region and a plurality of corner portions connecting the side portions, and the connection electrode is not disposed at the side portions, but disposed at the corner portions.

22. A device according to claim 20, wherein the connection electrode is disposed in contact with the first diffusion layer.

23. A device according to claim 20, wherein the first contact electrode, the second contact electrode, and the connection electrode are integrally formed.

24. A device according to claim 20, wherein, in a first direction connecting the active region to the junction-termination region with a shortest distance, a distance between an innermost position where the first contact electrode is in contact with the first diffusion layer, and an outermost position where the second contact electrode is in contact with the first diffusion layer is set to fall in a range of from 10 to 300 $\mu$m.

* * * * *